(12) United States Patent
Lin et al.

(10) Patent No.: US 10,790,143 B1
(45) Date of Patent: Sep. 29, 2020

(54) SEMICONDUCTOR STRUCTURE, HIGH ELECTRON MOBILITY TRANSISTOR, AND METHOD FOR FABRICATING SEMICONDUCTOR STRUCTURE

(71) Applicant: VANGUARD INTERNATIONAL SEMICONDUCTOR CORPORATION, Hsinchu (TW)

(72) Inventors: Yung-Fong Lin, Taoyuan (TW); Cheng-Tao Chou, Yunlin County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/502,711

(22) Filed: Jul. 3, 2019

(51) Int. Cl.
| | | |
|---|---|---|
| H01L 21/02 | (2006.01) | |
| H01L 29/20 | (2006.01) | |
| H01L 33/00 | (2010.01) | |
| H01L 29/205 | (2006.01) | |
| H01L 29/06 | (2006.01) | |
| H01L 29/778 | (2006.01) | |
| H01L 29/66 | (2006.01) | |

(Continued)

(52) U.S. Cl.
CPC .... *H01L 21/02488* (2013.01); *H01L 21/0242* (2013.01); *H01L 21/0243* (2013.01); *H01L 21/0254* (2013.01); *H01L 21/02458* (2013.01); *H01L 21/02505* (2013.01); *H01L 29/0653* (2013.01); *H01L 29/2003* (2013.01); *H01L 29/205* (2013.01); *H01L 29/66462* (2013.01); *H01L 29/7787* (2013.01); *H01L 33/007* (2013.01); *H01L 33/12* (2013.01); *H01L 33/20* (2013.01); *H01L 33/32* (2013.01)

(58) Field of Classification Search
CPC ........... H01L 21/02488; H01L 21/0242; H01L 21/0243; H01L 21/02458; H01L 21/02505; H01L 21/0254; H01L 29/0653; H01L 29/2003; H01L 29/205; H01L 29/66462; H01L 29/7787; H01L 33/007; H01L 33/12; H01L 33/20; H01L 33/32
USPC ....................................................... 257/76
See application file for complete search history.

(56) References Cited

U.S. PATENT DOCUMENTS 10,347,747 B2 * 7/2019 Zhao ................. H01L 21/26586

FOREIGN PATENT DOCUMENTS

| TW | 201810543 A | 3/2018 |
| TW | 201810654 A | 3/2018 |

OTHER PUBLICATIONS

Taiwanese Office Action and Search Report for Taiwanese Application No. 108110198, dated Dec. 20, 2019.

\* cited by examiner

Primary Examiner — Tu-Tu V Ho
(74) Attorney, Agent, or Firm — Birch, Stewart, Kolasch & Birch, LLP

(57) ABSTRACT

A semiconductor structure, a high electron mobility transistor (HEMT), and a method for fabricating a semiconductor structure are provided. The semiconductor structure includes a substrate, a flowable dielectric material pad layer, a reflow protection layer, and a GaN-based semiconductor layer. The substrate has a pit exposed from a top surface of the substrate. The flowable dielectric material pad layer is formed in the pit, and a top surface of the flowable dielectric material pad layer is below the top surface of the substrate. The reflow protection layer is formed on the substrate and the top surface of the flowable dielectric material pad layer.

(Continued)

The GaN-based semiconductor layer is disposed over the substrate.

20 Claims, 8 Drawing Sheets

(51) Int. Cl.
*H01L 33/12* (2010.01)
*H01L 33/20* (2010.01)
*H01L 33/32* (2010.01)

SEMICONDUCTOR STRUCTURE, HIGH ELECTRON MOBILITY TRANSISTOR, AND METHOD FOR FABRICATING SEMICONDUCTOR STRUCTURE

BACKGROUND

Technical Field

The present disclosure relates to semiconductor fabricating technology, and more particularly to semiconductor structures having a GaN-based semiconductor material, high electron mobility transistors, and methods for fabricating the same.

Description of the Related Art

Gallium nitride-based (GaN-based) semiconductor materials have many excellent characteristics, such as high thermal resistance, wide band-gap, and high electron saturation rates. Therefore, GaN-based semiconductor materials are suitable for use in high-speed and high-temperature operating environments. In recent years, GaN-based semiconductor materials have been widely used in light-emitting diode (LED) elements and high-frequency elements, such as high electron mobility transistors (HEMTs) with heterogeneous interfacial structures.

With the developments of GaN-based semiconductor materials, semiconductor structures that adopt GaN-based semiconductor materials are applied in more critical working environments, such as those with higher frequencies, higher temperatures, or higher voltages. Therefore, the process conditions of fabricating semiconductor devices with GaN-based semiconductor materials face various new challenges.

SUMMARY

Some embodiments of the present disclosure provide a semiconductor structure. The semiconductor structure includes a substrate, a flowable dielectric material pad layer, a reflow protection layer, and a GaN-based semiconductor layer. The substrate has a pit exposed from a top surface of the substrate. The flowable dielectric material pad layer is formed in the pit, and a top surface of the flowable dielectric material pad layer is below the top surface of the substrate. The reflow protection layer is formed on the substrate and the top surface of the flowable dielectric material pad layer. The GaN-based semiconductor layer is disposed over the substrate.

Some embodiments of the present disclosure provide a high electron mobility transistor (HEMT). The HEMT includes an aluminum nitride substrate, a flowable dielectric material pad layer, a reflow protection layer, a GaN semiconductor layer, a AlGaN semiconductor layer, a source electrode, a drain electrode, and a gate electrode. The aluminum nitride substrate has a pit exposed from a top surface of the aluminum nitride substrate. The flowable dielectric material pad layer is formed in the pit, and a top surface of the flowable dielectric material pad layer is below the top surface of the aluminum nitride substrate. The reflow protection layer is formed on the aluminum nitride substrate and the top surface of the flowable dielectric material pad layer. The GaN semiconductor layer is disposed over the reflow protection layer. The AlGaN semiconductor layer is disposed over the GaN semiconductor layer. The source electrode, the drain electrode, and the gate electrode are disposed over the AlGaN semiconductor layer.

Some embodiments of the present disclosure provide a method for fabricating a semiconductor structure. The method includes providing a substrate, wherein the substrate has a pit exposed from a top surface of the substrate; forming a flowable dielectric material on the substrate; performing a thermal treatment so that the flowable dielectric material reflows into the pit; removing a portion of the flowable dielectric material outside the pit for exposing the top surface of the substrate to form a flowable dielectric material pad layer in the pit, wherein a top surface of the flowable dielectric material pad layer is below the top surface of the substrate; forming a reflow protection layer on the substrate and the top surface of the flowable dielectric material pad layer; and forming a GaN-based semiconductor layer over the reflow protection layer.

The semiconductor structures of the present disclosure can be applied to various types of semiconductor devices. In order to make features and advantages of the present disclosure easy to understand, a detailed description with reference to the accompanying drawings is given in the following embodiments where the semiconductor structures are applied to HEMTs.

BRIEF DESCRIPTION OF THE DRAWINGS

In order to make features and advantages of the present disclosure easier to understand, a detailed description is given in the following various embodiments with reference to the accompanying drawings.

DETAILED DESCRIPTION

Figure 1A:
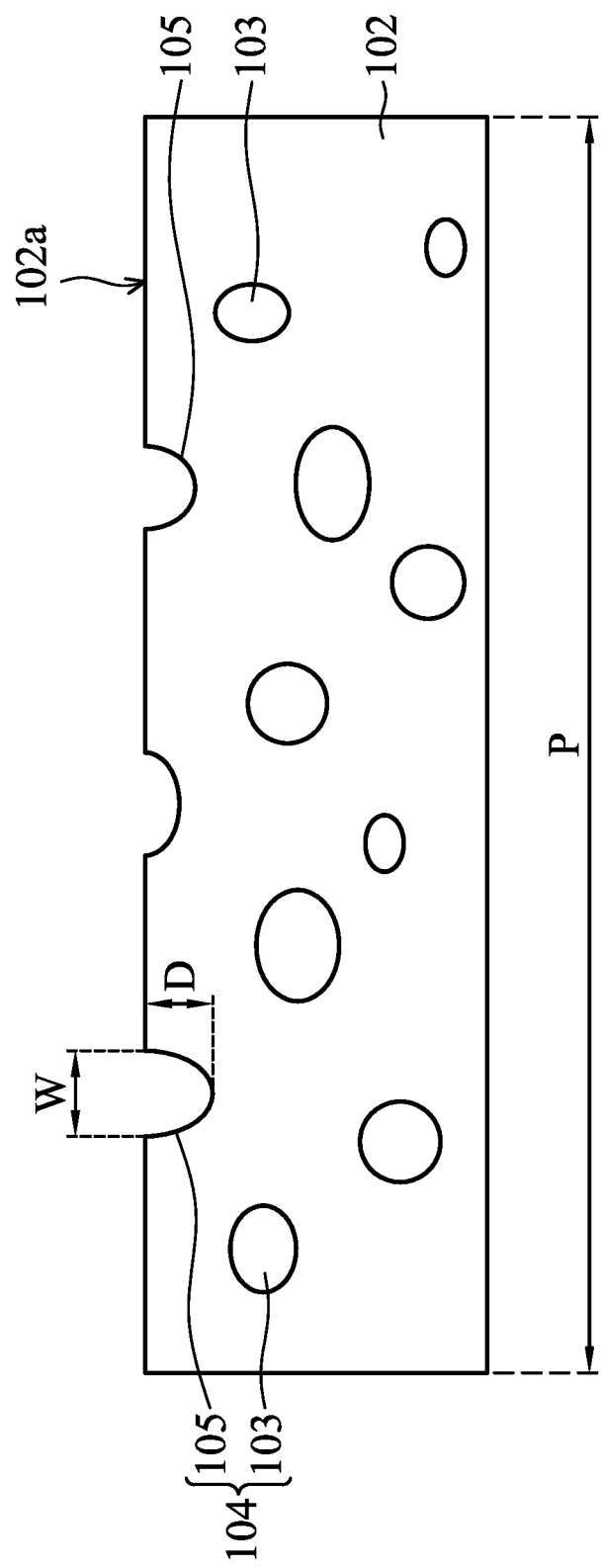
FIGS. 1A-1G illustrate cross-sectional views of forming a substrate structure at various intermediate stages in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of some embodiments are discussed below. Throughout the various views and illustrative embodiments, like reference numbers are used to designate like elements. It should be understood that additional operations can be provided before, during, and after the method, and some of the operations described can be replaced or eliminated for other embodiments of the method.

The terms "about", "approximately", and "substantially" used herein generally refer to the value of an error or a range within 20 percent, preferably within 10 percent, and more preferably within 5 percent, within 3 percent, within 2 percent, within 1 percent, or within 0.5 percent. If there is no specific description, the values mentioned are to be regarded as an approximation that is an error or range expressed as "about", "approximate", or "substantially".

The embodiments of the present disclosure provide semiconductor structures, HEMTs, and methods for fabricating semiconductor structures. Generally, a semiconductor device including a GaN-based semiconductor material is formed over a ceramic substrate. Since the ceramic substrate formed by powder metallurgy normally has pits formed at the surface of the substrate, when the ceramic substrate is used for semiconductor processes, material layers formed on the substrate are also formed in the pits, resulting in adverse effects on the as-formed semiconductor devices. The embodiments of the present disclosure provide a method for fabricating a semiconductor structure. The method includes forming a flowable dielectric material on a substrate having pits exposed from the top surface of the substrate, and reflowing the flowable dielectric material into the pits by a thermal treatment to form a flowable dielectric material pad layer in the pits. The method further includes depositing a reflow protection layer on the flowable dielectric material pad layer to fill the pits, so that the as-formed substrate structure can be provided with a planar surface for subsequent semiconductor processes. In addition, the reflow protection layer can prevent the second reflow of the flowable dielectric material, which is caused by subsequent high-temperature processes, from happening, so that the semiconductor materials or components in subsequent semiconductor processes are not adversely affected by the second reflow of the flowable dielectric material, and the manufacturing yields of semiconductor devices can be further improved.

Figure 1B:
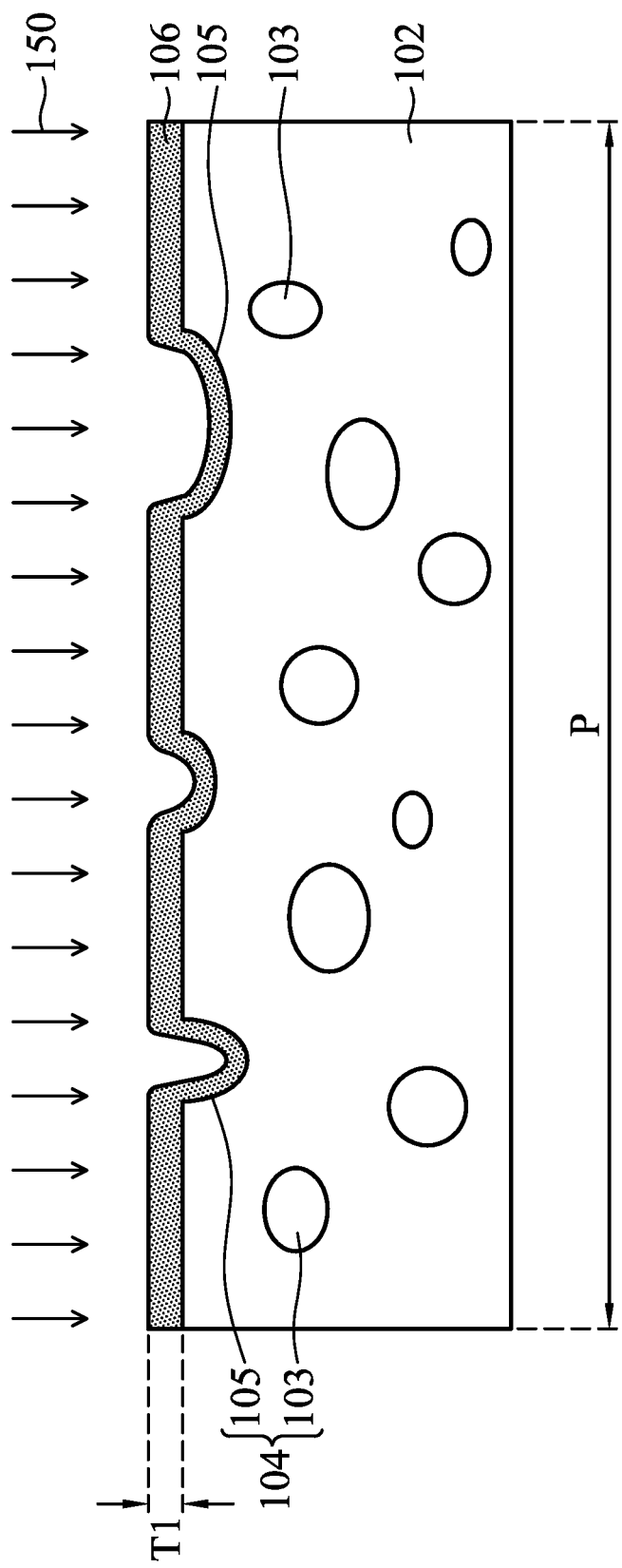
Figure 1C:
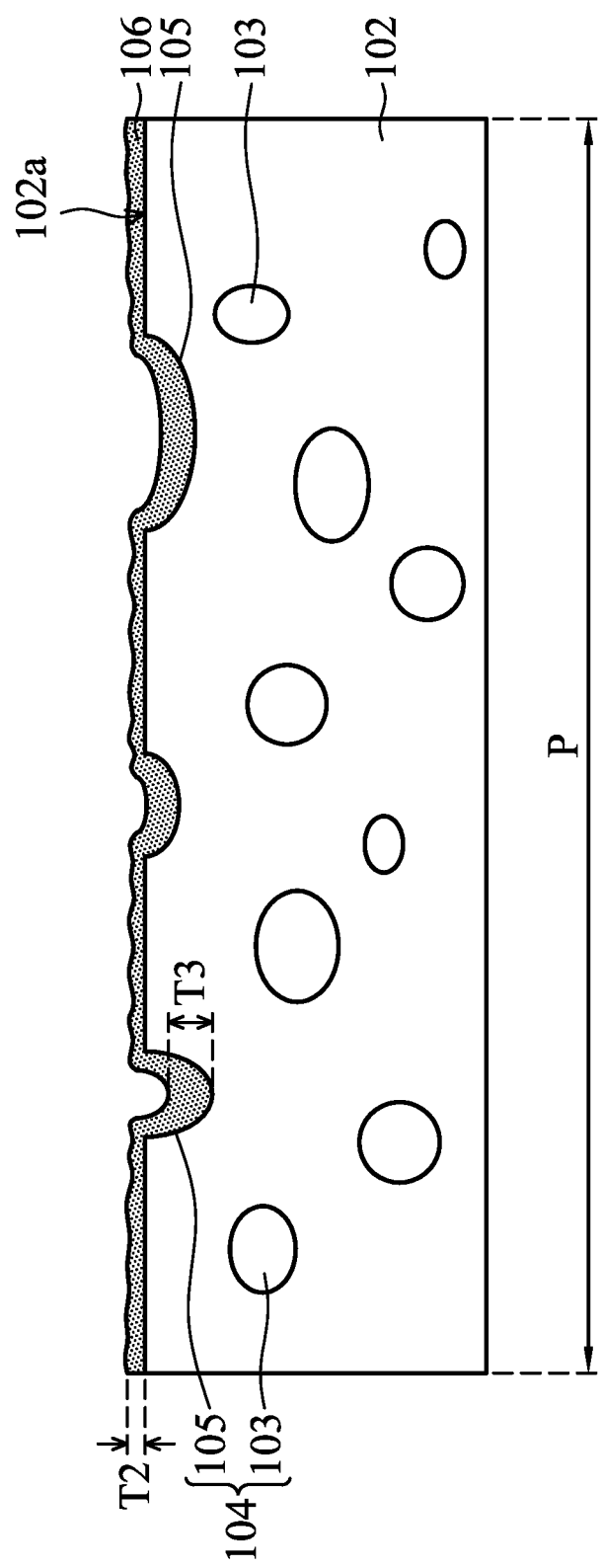
Figure 1D:
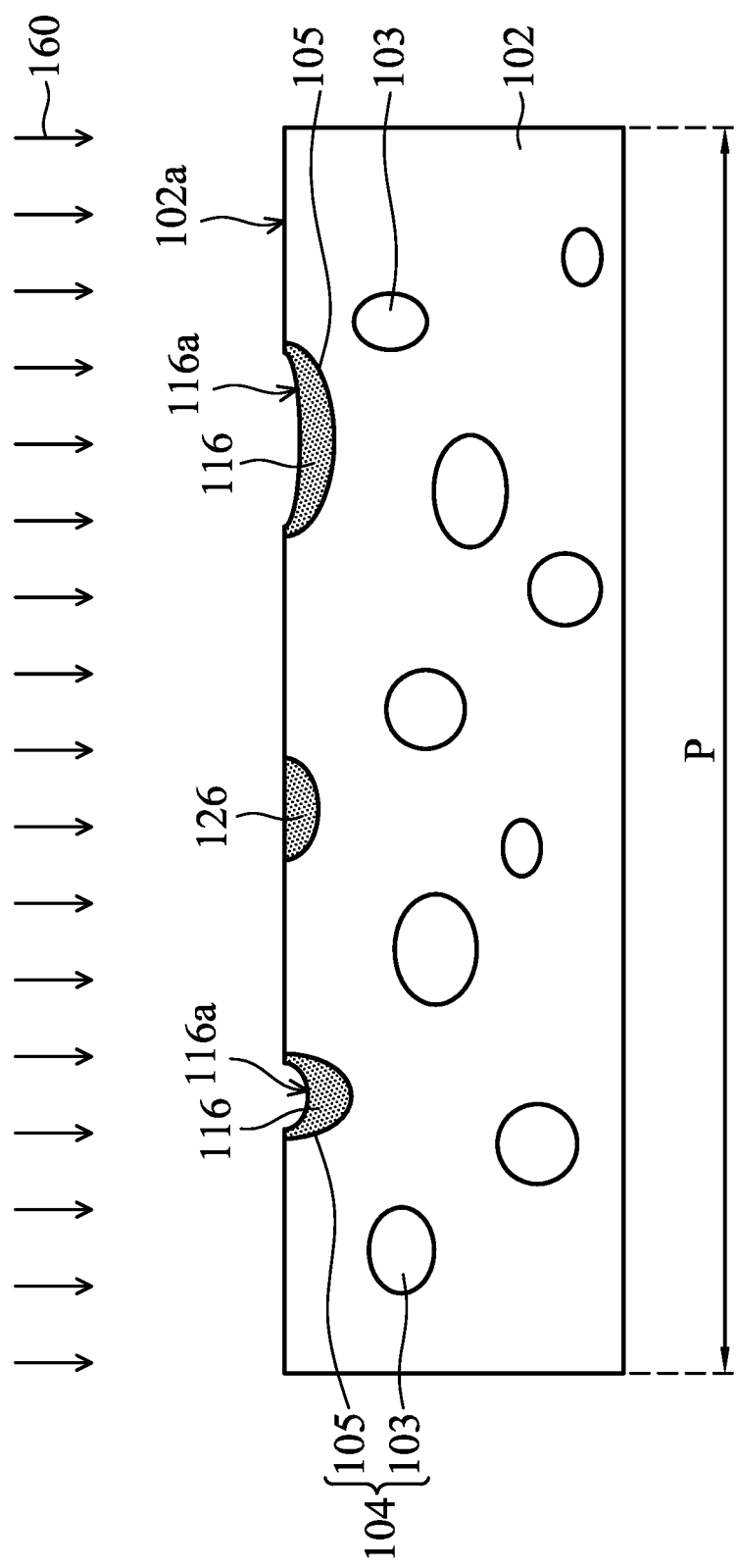
Figure 1E:
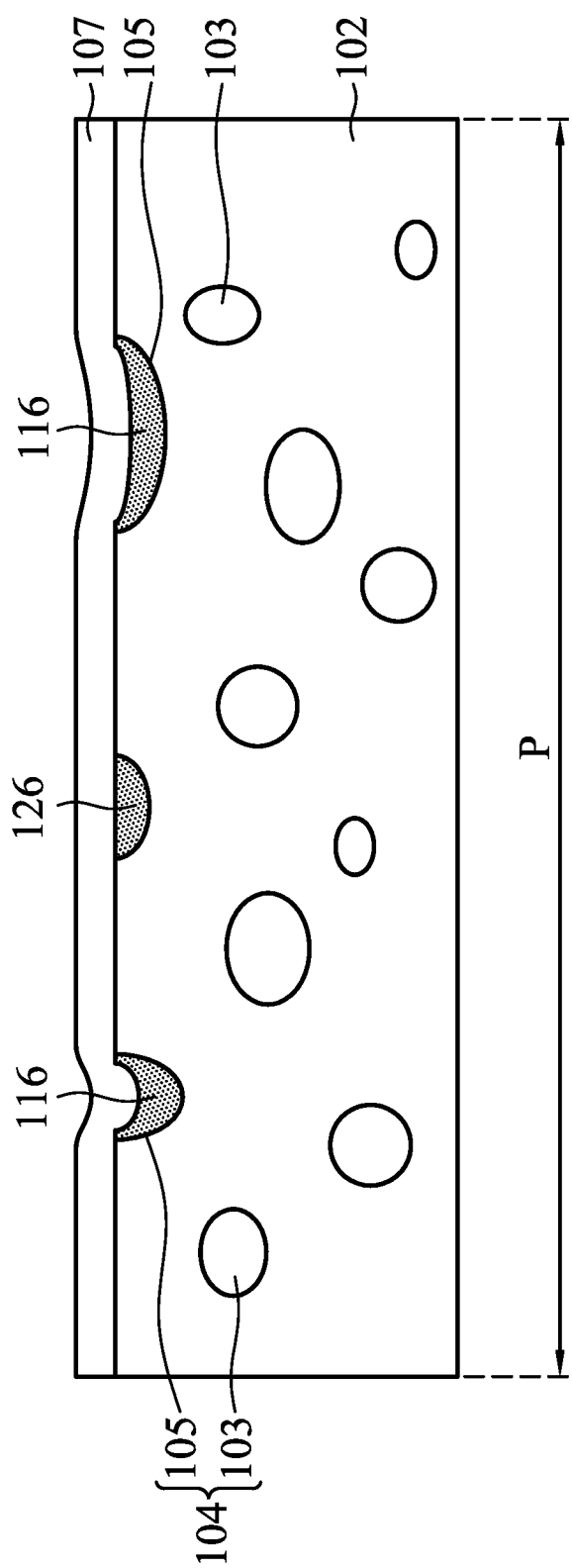
Figure 1F:
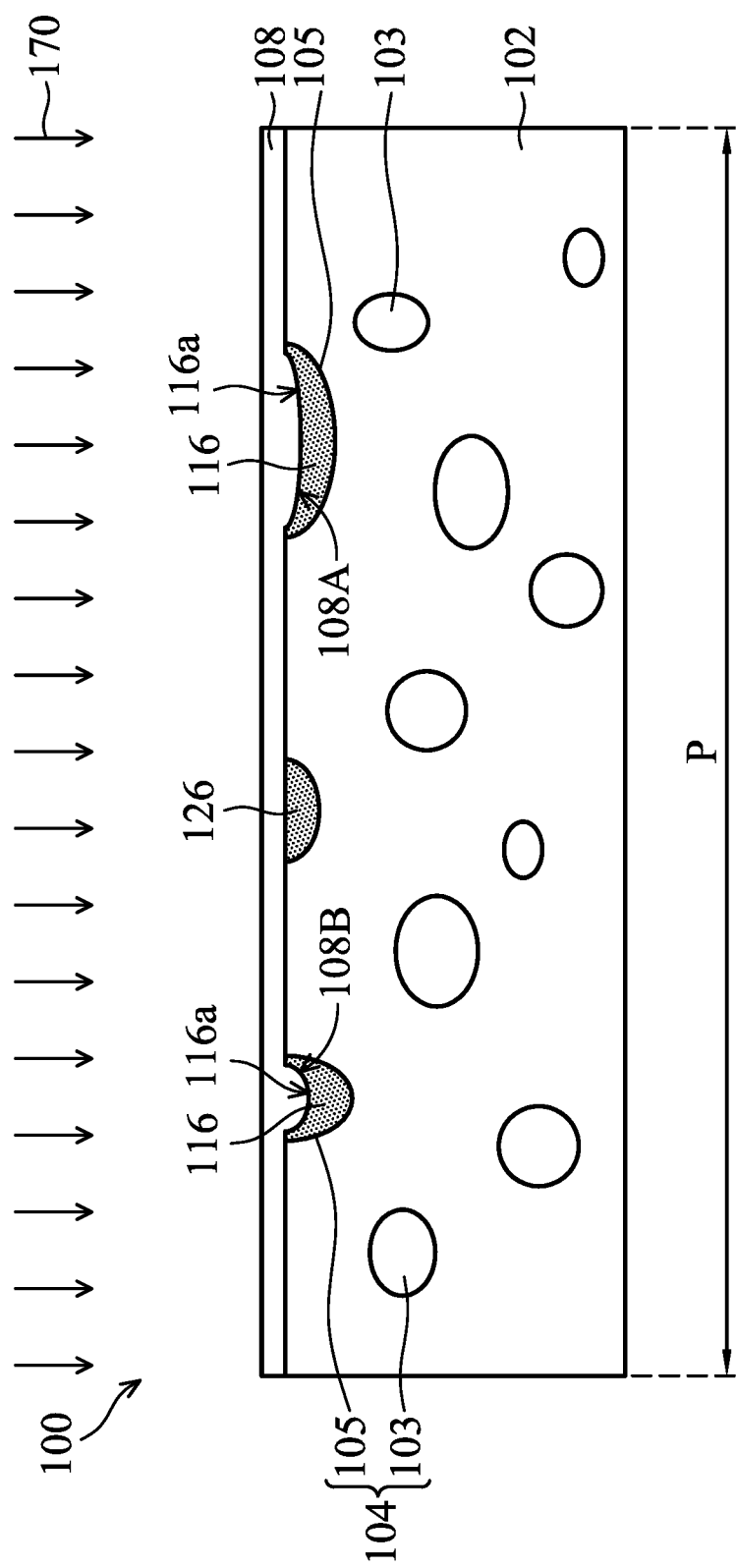
Figure 1G:
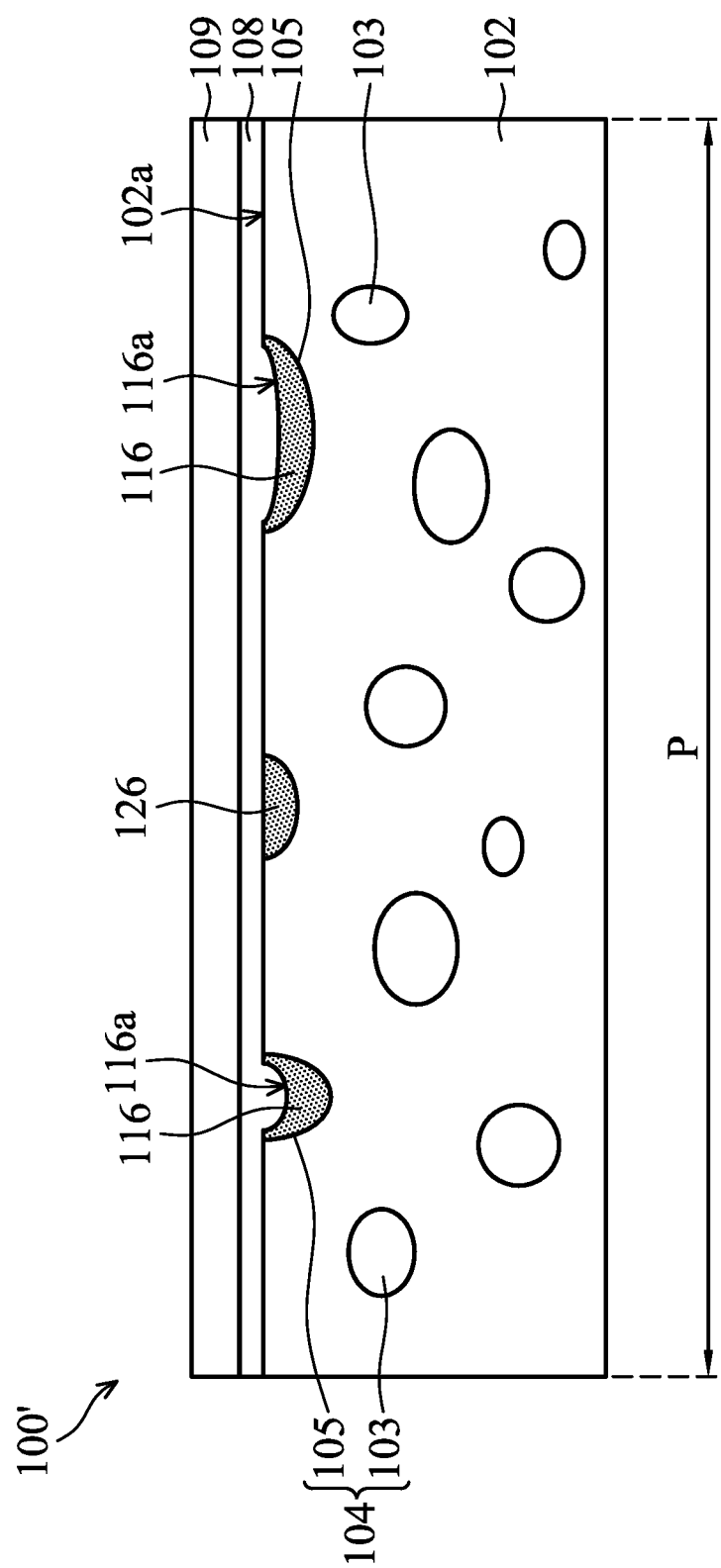

FIGS. 1A-1G illustrate cross-sectional views of forming a substrate structure 100' as shown in FIG. 1G at various intermediate stages in accordance with some embodiments of the present disclosure. Referring to FIG. 1A, a substrate 102 is provided. The substrate 102 may be circular, and the substrate 102 has a diameter P which may be 4 inches or more, such as 6 inches, 8 inches, or 12 inches, making it suitable for use in manufacturing equipment used in the semiconductor industry.

The substrate 102 intrinsically has some defects 104. The defects 104 include holes 103 within the substrate 102 and pits 105 exposed from the top surface 102a of the substrate 102. In some embodiments, the substrate 102 is a ceramic substrate formed by powder metallurgy in which ceramic powders are sintered at a high temperature. For example, the substrate 102 is an aluminum nitride (AlN) substrate, a silicon carbide (SiC) substrate, a sapphire substrate, other suitable similar substrates, or a combination thereof. In some embodiments, during sintering the ceramic powders to form the substrate 102, gaps between the ceramic powders gradually shrink, but these gaps do not completely disappear after the sintering of the ceramic powders is completed. Thus, some defects 104 still remain in the interior of the substrate 102 as well as on the surface of the substrate 102. In addition, even the sintered substrate 102 is polished and ground to remove the pits 105 at the surface, the holes 103 within the substrate 102 still will be exposed, and new pits 105 are generated on the top surface 102a of the substrate 102.

In some embodiments, the substrate 102 is used to fabricate a semiconductor device including a GaN-based semiconductor layer, such as a light-emitting diode (LED), a high frequency device, or a high voltage device. The high frequency device or the high voltage device may be, for example, a high electron mobility transistor (HEMT), a Schottky bipolar diode (SBD), a bipolar junction transistor (BJT), a junction field effect transistor (JFET), or an insulated gate bipolar transistor (IGBT).

It should be noted that although the pits 105 as shown in FIG. 1A have curved cross-sectional profiles, the shapes of the pits 105 are not limited thereto. In some embodiments, the pits 105 may have irregular cross-sectional profiles (not shown in drawings). In the cross-sectional view as shown in FIG. 1A, the pits 105 may have a width W that is measured along a lateral direction and a depth D that is measured along a longitudinal direction. In some embodiments of the present disclosure, when a pit 105 has a depth D greater than its width W, the size of the pit 105 may be defined by its depth D. On the other hand, when a pit 105 has a width W greater than its depth W, the size of the pit 105 may be defined by its width W. Generally, in some embodiments, the size of the pits 105 may be in a range from about 0.5 µm to about 15 µm.

Referring to FIG. 1B, a flowable dielectric material 106 is formed on the top surface 102a of the substrate 102. As shown in FIG. 1B, in the embodiments, the flowable dielectric material 106 is formed conformally in the pits 105. The flowable dielectric material 106 has a thickness T1 on the top surface 102a of the substrate 102. In some embodiments, since most of the pits 105 have the sizes that are greater than the thickness T1 of the flowable dielectric material 106, most of the pits 105 are not fully filled by the flowable dielectric material 106.

In the embodiments of the present disclosure, the flowable dielectric material 106 is in solid-state at room temperature. As the flowable dielectric material 106 is heated by a thermal treatment, the heated flowable dielectric material 106 turns to exhibit liquid-like flowability. In other words, the flowable dielectric material 106 is a dielectric material that has no flowability at a relatively low temperature but has flowability at a relatively high temperature. In some embodiments, the flowable dielectric material 106 may include spin-on glass (SOG), borophosphosilicate glass (BPSG), phosphosilicate glass (PSG), borosilicate glass (BSG), fluorosilicate glass (FSG), or a combination thereof. In some embodiments, the flowable dielectric material 106 may be formed by spin-on coating, chemical vapor deposition, suitable similar methods, or a combination thereof.

Next, as shown in FIG. 1C, after the flowable dielectric material 106 is formed, a thermal treatment 150 is performed on the substrate 102 on which the flowable dielectric material 106 is formed, so that the flowable dielectric material 106 may have flowability to reflow. As shown in FIG. 1C, in the embodiments of the present disclosure, the flowable dielectric material 106 reflows into the pits 105 by the thermal treatment 150. In the embodiments, despite that most of the pits 105 are not fully filled by the flowable dielectric material 106, after the thermal treatment, the flowable dielectric material 106 located on the top surface 102a of the substrate 102 may have a reduced thickness T2, and the flowable dielectric material 106 located in the pits 105 has an increased thickness T3. For example, the thickness T3 is greater than the thickness T1, and the thickness T1 is greater than the thickness T2.

According to the embodiments of the present disclosure, the thermal treatment 150 can make the flowable dielectric material 106 reflow into the pits 105. As a result, the amounts of the semiconductor materials, which are supposed to be grown on the top surface 102a of the substrate 102, grown in the pits 105 can be reduced. As such, the situation where the pits 105 becoming the killer defects for semiconductor devices can be prevented, and the manufacturing yields of the semiconductor devices can be further improved. In addition, using the flowable dielectric material 106, which can turn flowable when subjected to the thermal treatment 150, to fill the pits 105 can greatly reduce the deposited thickness of the dielectric material used for filling the pits 105 as well as the manufacturing time, and the manufacturing costs are further reduced.

In some embodiments of the present disclosure, the thermal treatment 150 is performed at a temperature that is in a range from 300° C. to 800° C.

In some embodiments, the flowable dielectric material 106 is such as spin-on glass (SOG), and the temperature of the thermal treatment 150 is in a range from about 300° C. to about 500° C., such as from about 350° C. to about 450° C. The duration of the thermal treatment 150 may be in a range from about 20 minutes to about 60 minutes. When the temperature of the thermal treatment 150 is lower than 300° C., SOG may not be reflowed. When the temperature of the thermal treatment 150 is higher than 500° C., the flowability of SOG may be too high and thus cause SOG to expand, such that after the temperature is reduced, cracks may form between SOG and the substrate 102, and the substrate 102 may even break.

In some embodiments where the flowable dielectric material 106 is SOG, the ratio of the thickness T1 of the flowable dielectric material 106 on the top surface 102a of the substrate 102 to the size of the pit 105 (e.g., the depth D of the pit 105) may be in a range from about 0.15 to about 0.6, such as in a range from about 0.15 to about 0.3. After the thermal treatment 105 is performed, the ratio of the thickness T3 of the reflowed flowable dielectric material 106 in the pit 105 to the size of the pit 105 (e.g., the depth D of the pit 105) may be in a range from about 0.15 to about 0.8, such as in a range from about 0.3 to about 0.8.

In some embodiments, the flowable dielectric material 106 is such as BPSG, PSG, BSG, and/or FSG, the temperature of the thermal treatment 150 may be in a range from about 600° C. to about 800° C., such as from about 650° C. to about 800° C. The duration of the thermal treatment 150 may be in a range from about 20 minutes to about 60 minutes. When the temperature of the thermal treatment 150 is lower than 600° C., BPSG, PSG, BSG, and/or FSG may not be reflowed. When the temperature of the thermal treatment 150 is higher than 800° C., the flowability of BPSG, PSG, BSG, and/or FSG may be too high and cause BPSG, PSG, BSG, and/or FSG to expand. As a result, after the temperature is reduced, cracks may form between the aforementioned flowable dielectric material 106 and the substrate 102, and the substrate 102 may even break.

In some embodiments where the flowable dielectric material 106 is borophosphosilicate glass (BPSG), phosphosilicate glass (PSG), borosilicate glass (BSG), and/or fluorosilicate glass (FSG), the ratio of the thickness T1 of the flowable dielectric material 106 on the top surface 102a of the substrate 102 to the size of the pit 105 (e.g., the depth D of the pit 105) may be in a range from about 0.3 to about 0.6. After the thermal treatment 105 is performed, the ratio of the thickness T3 of the reflowed flowable dielectric material 106 in the pit 105 to the size of the pit 105 (e.g., the depth D of the pit 105) may be in a range from about 0.3 to about 0.8.

Next, as shown in FIG. 1D, a portion of the flowable dielectric material 106 outside the pit 105 is removed to expose the top surface 102a of the substrate 102 so as to form flowable dielectric material pad layers 116 and 126 in the pits 105. In the embodiments, as shown in FIG. 1D, the top surface 116a of the flowable dielectric material pad layer 116 is below the top surface 102a of the substrate 102.

In some embodiments, as shown in FIG. 1D, a planarization process 160 may be performed on the flowable dielectric material 106 to remove the portion of the flowable dielectric material 106 outside the pit 105 to form the flowable dielectric material pad layers 116 and 126. In some embodiments, the planarization process 160 is such as a chemical mechanical polishing (CMP).

In some embodiments, as shown in FIG. 1D, the top surface 116a of the flowable dielectric material pad layer 116 has a concave profile. In some embodiments, as shown in FIG. 1D, the top surface of the flowable dielectric material pad layer 126 is substantially coplanar with the top surface 102a of the substrate 102.

In some embodiments, as shown in FIG. 1D, the ratio of the thickness T5 of the flowable dielectric material pad layer 116 to the depth D of the pit 105 is in a range from about 0.15 to about 0.8.

Next, referring to FIG. 1E, in some embodiments, a reflow protection layer 107 is deposited conformally on the substrate 102 and the top surface 116a of the flowable dielectric material pad layer 116 by a deposition process. In some embodiments, the reflow protection layer 107 is also deposited conformally on the flowable dielectric material pad layer 126. In some embodiments, the reflow protection layer 107 is blanketly deposited on and covering the flowable dielectric material pad layers 116 and 126.

In the embodiments of the present disclosure, compared to the flowable dielectric material 106, the reflow protection layer 107 is a high-quality film with good thermal stability at high temperature. In some embodiments, the reflow protection layer 107 may include silicon oxide, silicon nitride, silicon oxynitride, silicon carbide, or a combination thereof. In some embodiments, the reflow protection layer 107 is deposited at a processing temperature that is in a range from 1000° C. to 1200° C. In some embodiments, the reflow protection layer 107 is formed by a process which may include plasma enhanced chemical vapor deposition (PECVD), low-temperature chemical vapor deposition (LP-CVD), or a combination thereof.

In some embodiments, the reflow protection layer 107 is such as a silicon oxide film made of tetraethoxysilane (TEOS) by low-temperature chemical vapor deposition (LP-CVD). In some embodiments, the reflow protection layer 107 is such as a dielectric layer formed by plasma enhanced chemical vapor deposition (PECVD), and the dielectric layer may include silicon oxide, silicon nitride, silicon oxynitride, silicon carbide, suitable similar materials, or a combination thereof.

Next, as shown in FIG. 1F, in some embodiments, a planarization process 170 may be performed on the reflow protection layer 107 to partially remove the reflow protection layer 107 so as to form a reflow protection layer 108 having a planar top surface. In some embodiments, the planarization process 170 is such as a CMP process. As such, the reflow protection layer 108 is formed on the substrate 102, the flowable dielectric material pad layer 126, and the top surface 116a of the flowable dielectric material pad layer 116.

In some embodiments, after the planarization process 170, a substrate structure 100 as shown in FIG. 1F is formed. The substrate structure 100 has a substantially planar top surface (i.e. the planarized top surface of the reflow protection layer 108) to provide semiconductor devices to be formed thereon.

In some embodiments, as shown in FIG. 1F, the reflow protection layer 108 is conformally deposited on the top surface 116a of the flowable dielectric material pad layer 116. As such, the reflow protection layer 108 has a protruding portion 108B that extends into and fills the pits 105.

In some embodiments, as shown in FIG. 1F, the protruding portion 108B of the reflow protection layer 108 is in direct contact with the top surface 116a of the flowable dielectric material pad layer 116. In some embodiments, as shown in FIG. 1F, a bottom surface 108A of the protruding portion 108B of the reflow protection layer 108 is conformal with the top surface 116a of the flowable dielectric material pad layer 116.

According to some embodiments of the present disclosure, while using the flowable dielectric material 106 in order to achieve the aforementioned advantages of reducing manufacturing costs and manufacturing time, since the flowable dielectric material 106 is provided with high flowability when subject to the thermal treatment, it may cause the pits 105 to be filled incompletely. In this regard, the protruding portion 108B of the reflow protection layer 108 extends into and fills the pits 105, and thereby is formed conformally on the top surface 116a of the flowable dielectric material pad layer 116. Thus, the pits 105 that are not fully filled by the flowable dielectric material 106 can be further fully filled, such that the defects of the substrate 102 can be perfectly fixed, and the manufacturing yields of semiconductor devices can be further improved.

Moreover, according to some embodiments of the present disclosure, the reflow protection layer 108 may be an insulating protection layer formed by a high-temperature process. When the processing temperature of one or more subsequent semiconductor manufacturing processes is higher than the processing temperature for the second reflow of the flowable dielectric material 106 to occur, the reflow protection layer 108 can prevent the flowable dielectric material 106 (i.e., the flowable dielectric material pad layers 116 and 126) from overflowing, expanding, or exploding due to the occurrence of the second reflow. Furthermore, adverse influences, which may be caused by the high temperature of the subsequent one or more semiconductor manufacturing processes, on the semiconductor materials formed on the flowable dielectric material 106 (i.e., the flowable dielectric material pad layers 116 and 126) can be further prevented. For example, peelings or cracking of the semiconductor materials or components can be prevented.

Next, referring to FIG. 1G, a GaN-based semiconductor layer 109 is formed over the reflow protection layer 108. In some embodiments, the GaN-based semiconductor layer 109 includes such as a GaN semiconductor layer 112, an AlGaN semiconductor layer 114, which will be described hereinafter, other suitable similar GaN-based semiconductor layers, or a combination thereof.

In some embodiments, the GaN-based semiconductor layer 109 may be formed by using an epitaxial growth process, such as metal organic chemical vapor deposition (MOCVD), hydride vapor phase epitaxy (HYPE), molecular beam epitaxy (MBE), suitable similar methods, or a combination thereof. In some embodiments, the GaN-based semiconductor layer 109 may be formed at a processing temperature that is higher than the temperature of the thermal treatment. In some embodiments, the processing temperature for forming the GaN-based semiconductor layer 109 may be higher than 800° C. In some embodiments, the processing temperature for forming the GaN-based semiconductor layer 109 may be higher than 1000° C.

In the embodiments of the present disclosure, after the GaN-based semiconductor layer 109 is formed, the substrate structure 100' as shown in FIG. 1G is formed. According to the embodiments of the present disclosure, the substrate structure 100 or 100' has a planar top surface to form devices including a GaN-based semiconductor material thereon. The semiconductor device including a GaN-based semiconductor material may be a light-emitting diode (LED), a high electron mobility transistor (HEMT), a Schottky bipolar diode (SBD), a bipolar junction transistor (BJT), a junction field effect transistor (JFET), an insulated gate bipolar transistor (IGBT), or the like. A method for forming a semiconductor device over the substrate structure 100 as shown in FIG. 1F is described below, and a HEMT is used as an example.

Figure 2:
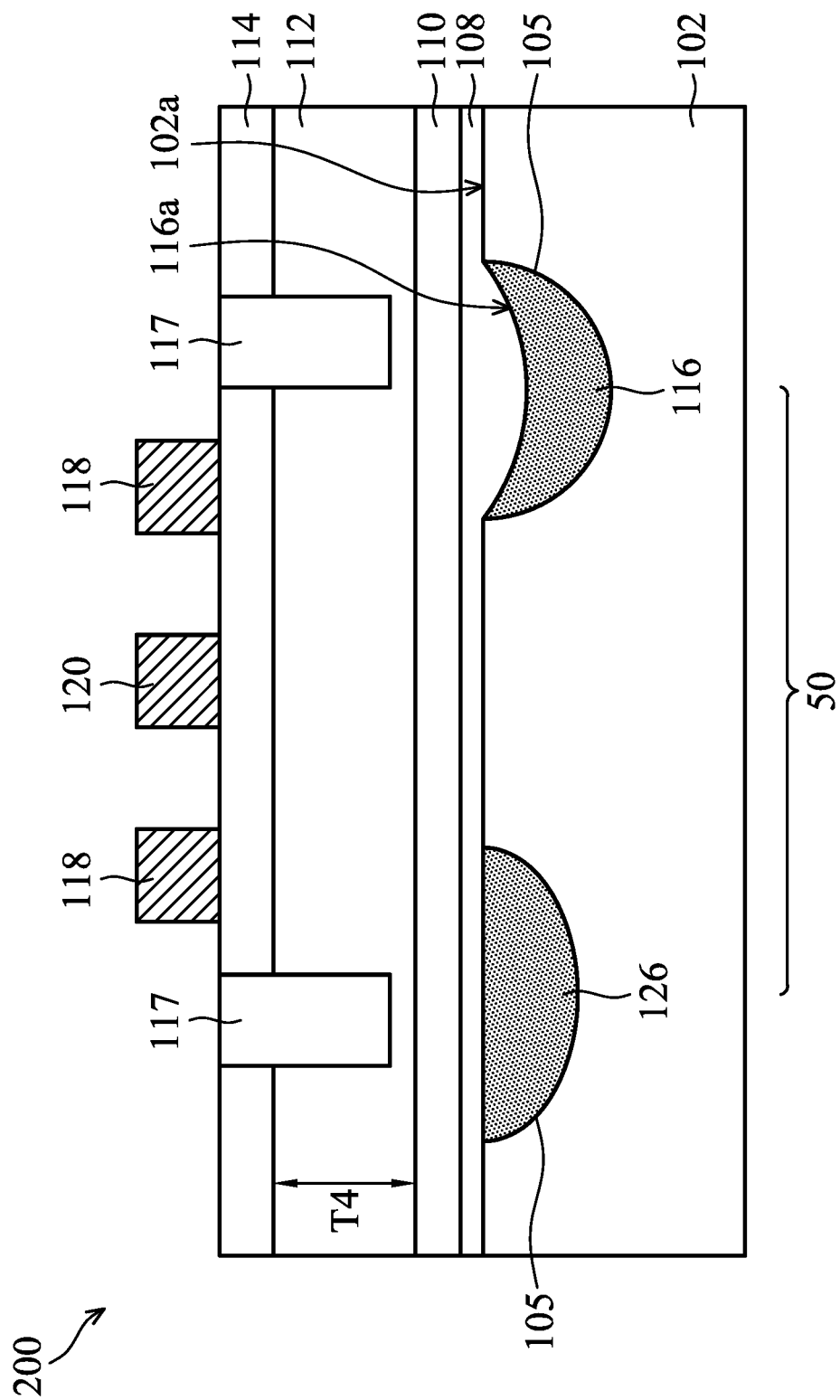
FIG. 2 shows a cross-sectional view of a HEMT formed by using the substrate structure in FIG. 1F in accordance with some embodiments of the present disclosure.

FIG. 2 shows a cross-sectional view of a high electron mobility transistor (HEMT) formed by using the substrate structure as shown in FIG. 1F in accordance with some embodiments of the present disclosure. The elements in the present embodiment sharing similar or the same labels with those in the previous embodiment are similar or the same elements, and the description of which is omitted.

Generally, the breakdown voltage of a HEMT mainly depends on the thickness of the GaN semiconductor layer which serves as a channel layer. For example, when the thickness of the GaN semiconductor layer is increased by the breakdown voltage of the HEMT may be increased by about 100 volts. During an epitaxial growth process for forming the GaN semiconductor layer, it is necessary to use a substrate with high thermal conductivity and high mechanical strength for a GaN semiconductor material to be deposited thereon; otherwise the substrate may warp or even crack. Thus, compared to a Si substrate, an aluminum nitride (AlN) substrate has higher thermal conductivity and higher mechanical strength, so that a relatively thicker GaN semiconductor layer may be formed on the aluminum nitride (AlN) substrate. For example, the thickness of the GaN semiconductor layer formed on the surface of a Si substrate is from about 2 μm to about 4 μm, while the thickness of the GaN semiconductor layer formed on the surface of an aluminum nitride (AlN) substrate is from about 5 μm to about 15 μm.

Referring to FIG. 2, the substrate structure 100 as shown in the FIG. 1F is provided. FIG. 2 shows a portion of the substrate structure 100 as shown in FIG. 1F, where some pits 105 are present, and other components of the HEMT 200 are formed over the portion of the substrate structure 100. In the embodiment as shown in FIG. 2, the substrate 102 is an aluminum nitride (AlN) substrate.

Despite that the processing temperature for forming these other components of the HEMT 200 may be higher than 500° C., even higher than 800° C., according to the embodiments of the present disclosure, the reflow protection layer 108 is formed on the substrate 102 and the top surfaces of the flowable dielectric material pad layer 116 and 126 for covering the flowable dielectric material pad layer 116 and 126. Accordingly, the semiconductor materials or components formed in subsequent semiconductor manufacturing processes can be protected from adversely affected by the second reflow of the flowable dielectric material.

In some embodiments, the HEMT 200 may include a buffer layer 110 and a GaN semiconductor layer 112. The buffer layer 110 is formed on the top surface of the reflow protection layer 108, and the GaN semiconductor layer 112 is formed on the buffer layer 110. In some embodiments, the HEMT 200 may include an AlGaN semiconductor layer 114 and a seed layer (not shown in drawings). The AlGaN semiconductor layer 114 is formed on the GaN semiconductor layer 112, and the seed layer may be formed between the reflow protection layer 108 and the buffer layer 110.

In some embodiments, the material of the seed layer may be AlN, $Al_2O_3$, AlGaN, SiC, Al, or a combination thereof. The seed layer may be a single layer or a multilayered structure. The seed layer may be formed by using an epitaxial growth process, such as metal organic chemical vapor deposition (MOCVD), hydride vapor phase epitaxy (HYPE), molecular beam epitaxy (MBE), suitable similar methods, or a combination thereof.

In some embodiments, the buffer layer 110 may be helpful to mitigate the strain of the GaN semiconductor layer 112 which is subsequently formed over the buffer layer 110, so as to prevent defects from being formed in the overlying GaN semiconductor layer 112. The strain is caused by a mismatch between the GaN semiconductor layer 112 and the substrate 102. In some embodiments, the material of the buffer layer 110 may be AlN, GaN, $Al_xGa_{1-x}N$ (wherein 0<x<1), suitable similar materials, or a combination thereof. In some embodiments, the buffer layer 110 may be formed by using an epitaxial growth process, such as metal organic chemical vapor deposition (MOCVD), hydride vapor phase epitaxy (HYPE), molecular beam epitaxy (MBE), suitable similar methods, or a combination thereof. Although the buffer layer 110 is a single layer in the embodiment as shown in FIG. 2, the buffer layer 110 may also be a multilayered structure. In addition, in some embodiments, the material used to form the buffer layer 110 is determined by the material of the seed layer and the gas introduced during the epitaxial process.

Two-dimensional electron gas (2DEG, not shown in drawings) is formed at a heterogeneous interface between the GaN semiconductor layer 112 and the AlGaN semiconductor layer 114. In some embodiments, the GaN semiconductor layer 112 and the AlGaN semiconductor layer 114 may have no dopant therein. In some other embodiments, the GaN semiconductor layer 112 and the AlGaN semiconductor layer 114 may be doped, such as with an n-type dopant or a p-type dopant. The GaN semiconductor layer 112 and the AlGaN semiconductor layer 114 may be formed by using epitaxial growth processes, such as metal organic chemical vapor deposition (MOCVD), hydride vapor phase epitaxy (HYPE), molecular beam epitaxy (MBE), suitable similar methods, or a combination thereof.

According to some embodiments of the present disclosure, as shown in FIG. 2, since the substrate 102 is an aluminum nitride (AlN) substrate with high thermal conductivity and high mechanical strength, the GaN semiconductor layer 112 may be deposited to have a thickness T4 which is from about 5 µm to about 15 µm.

In some embodiments, the HEMT 200 may include an isolation structure 117, and the isolation structure 117 is formed in the GaN semiconductor layer 112 and the AlGaN semiconductor layer 114 to define an active region 50. The material used to form the isolation structure 117 may be a dielectric material, such as silicon oxide, silicon nitride, silicon oxynitride, suitable similar materials, or a combination thereof. The isolation structure 117 may be formed by an etching process and a deposition process.

In some embodiments, the HEMT 200 may include source/drain electrodes 118 and a gate electrode 120 between the source/drain electrodes 118, and the source/drain electrodes 118 and the gate electrode 120 are formed on the AlGaN semiconductor layer 114 in the active region 50. In some embodiments, the material of the source/drain electrodes 118 and the gate electrode 120 may be conductive materials, such as metal, metal nitride, or semiconductor materials. The metal may be gold (Au), nickel (Ni), platinum (Pt), palladium (Pd), iridium (Ir), titanium (Ti), chromium (Cr), tungsten (W), aluminum (Al), copper (Cu), suitable similar materials, or a combination thereof. The semiconductor material may be polycrystalline silicon or polycrystalline germanium. The steps of forming the source/drain electrodes 118 and the gate electrode 120 may include depositing a conductive material on the AlGaN semiconductor layer 114, and then patterning the conductive material to form the source/drain electrodes 118 and the gate electrode 120. The source/drain electrodes 118 and the gate electrode 120 may be formed in the same process or may be formed separately in different processes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate having a pit exposed from a top surface of the substrate;
   a flowable dielectric material pad layer formed in the pit, wherein a top surface of the flowable dielectric material pad layer is below the top surface of the substrate;
   a reflow protection layer formed on the substrate and the top surface of the flowable dielectric material pad layer; and
   a GaN-based semiconductor layer disposed over the substrate.

2. The semiconductor structure as claimed in claim 1, wherein the top surface of the flowable dielectric material pad layer has a concave profile.

3. The semiconductor structure as claimed in claim 1, wherein a ratio of a thickness of the flowable dielectric material pad layer to a depth of the pit is in a range from 0.15 to 0.8.

4. The semiconductor structure as claimed in claim 1, wherein a protruding portion of the reflow protection layer extends into and fills the pit.

5. The semiconductor structure as claimed in claim 4, wherein the protruding portion of the reflow protection layer is in direct contact with the top surface of the flowable dielectric material pad layer.

6. The semiconductor structure as claimed in claim 4, wherein a bottom surface of the protruding portion of the reflow protection layer is conformal with the top surface of the flowable dielectric material pad layer.

7. The semiconductor structure as claimed in claim 1, wherein the substrate is an aluminum nitride substrate, a silicon carbide substrate, a sapphire substrate, or a combination thereof.

8. The semiconductor structure as claimed in claim 1, wherein the flowable dielectric material pad layer comprises spin-on glass (SOG), borophosphosilicate glass (BPSG), phosphosilicate glass (PSG), borosilicate glass (BSG), fluorosilicate glass (FSG), or a combination thereof.

9. The semiconductor structure as claimed in claim 1, wherein the reflow protection layer comprises silicon oxide, silicon nitride, silicon oxynitride, silicon carbide, or a combination thereof.

10. A high electron mobility transistor, comprising:
   an aluminum nitride substrate having a pit exposed from a top surface of the aluminum nitride substrate;
   a flowable dielectric material pad layer formed in the pit, wherein a top surface of the flowable dielectric material pad layer is below the top surface of the aluminum nitride substrate;
   a reflow protection layer formed on the aluminum nitride substrate and the top surface of the flowable dielectric material pad layer;
   a GaN semiconductor layer disposed over the reflow protection layer;
   a AlGaN semiconductor layer disposed over the GaN semiconductor layer; and
   a source electrode, a drain electrode, and a gate electrode disposed over the AlGaN semiconductor layer.

11. The high electron mobility transistor as claimed in claim 10, wherein a thickness of the GaN semiconductor layer is in a range from 5 μm to 15 μm.

12. A method for fabricating a semiconductor structure, comprising:
   providing a substrate, wherein the substrate has a pit exposed from a top surface of the substrate;
   forming a flowable dielectric material on the substrate;
   performing a thermal treatment so that the flowable dielectric material reflows into the pit;
   removing a portion of the flowable dielectric material outside the pit for exposing the top surface of the substrate to form a flowable dielectric material pad layer in the pit, wherein a top surface of the flowable dielectric material pad layer is below the top surface of the substrate;
   forming a reflow protection layer on the substrate and the top surface of the flowable dielectric material pad layer; and
   forming a GaN-based semiconductor layer over the reflow protection layer.

13. The method for fabricating the semiconductor structure as claimed in claim 12, wherein the substrate is an aluminum nitride substrate, a silicon carbide substrate, a sapphire substrate, or a combination thereof.

14. The method for fabricating the semiconductor structure as claimed in claim 12, wherein the flowable dielectric material comprises spin-on glass (SOG), borophosphosilicate glass (BPSG), phosphosilicate glass (PSG), borosilicate glass (BSG), fluorosilicate glass (FSG), or a combination thereof.

15. The method for fabricating the semiconductor structure as claimed in claim 12, wherein the thermal treatment is performed at a temperature that is in a range from 300° C. to 800° C.

16. The method for fabricating the semiconductor structure as claimed in claim 12, wherein the reflow protection layer comprises silicon oxide, silicon nitride, silicon oxynitride, silicon carbide, or a combination thereof.

17. The method for fabricating the semiconductor structure as claimed in claim 12, wherein the reflow protection layer is deposited conformally on the substrate and the top surface of the flowable dielectric material pad layer by a deposition process.

18. The method for fabricating the semiconductor structure as claimed in claim 17, wherein the reflow protection layer is deposited at a processing temperature that is in a range from 1000° C. to 1200° C.

19. The method for fabricating the semiconductor structure as claimed in claim 12, wherein forming the reflow protection layer is by a process comprising plasma enhanced chemical vapor deposition (PECVD), low-temperature chemical vapor deposition (LPCVD), or a combination thereof.

20. The method for fabricating the semiconductor structure as claimed in claim 12, wherein the GaN-based semiconductor layer is formed at a processing temperature that is higher than a temperature of the thermal treatment.

* * * * *